United States Patent [19]
Bhattacharyya et al.

[11] 3,978,577
[45] Sept. 7, 1976

[54] FIXED AND VARIABLE THRESHOLD N-CHANNEL MNOSFET INTEGRATION TECHNIQUE

[75] Inventors: Arup Bhattacharyya; Madhukar Laxman Joshi, both of Essex Junction; Charles Thomas Kroll, Essex Center; Ronald Silverman, Essex, all of Vt.

[73] Assignee: International Business Machines Corporation, Armonk, N.Y.

[22] Filed: June 30, 1975

[21] Appl. No.: 591,595

[52] U.S. Cl. .............................. 29/571; 29/578; 357/41
[51] Int. Cl.² ...................................... B01J 17/00
[58] Field of Search ............ 29/571, 578; 357/41, 357/23

[56] References Cited
UNITED STATES PATENTS

| | | | |
|---|---|---|---|
| 3,752,711 | 8/1973 | Kooi | 29/571 |
| 3,798,513 | 3/1974 | Ono | 357/41 |
| 3,829,888 | 8/1974 | Hashimoto | 357/41 |
| 3,837,071 | 9/1974 | Ronen | 29/571 |

*Primary Examiner*—W. Tupman
*Attorney, Agent, or Firm*—Howard J. Walter, Jr.

[57] ABSTRACT

Fully integrated non-volatile and fixed threshold field effect devices are fabricated in N-channel technology on a single semiconductor substrate. MOSFET devices of the metal-nitride-oxide-semiconductor (MNOS) devices are used both as fixed threshold support devices and as variable threshold non-volatile memory array devices. Extremely stable and reproducible device characteristics result from the use of low charge containing dielectrics which allow optimum variable threshold stability and allow the use of operating potentials compatable with conventional fixed threshold FET devices. Low temperature processing following deposition of variable threshold gate dielectric enables all enhancement mode operation. A field oxide structure including a thin silicon dioxide layer, an aluminum oxide layer and a nitride layer provides parasitic threshold voltages in excess of 60 volts and prevents sub-threshold leakage.

4 Claims, 5 Drawing Figures

FIXED AND VARIABLE THRESHOLD N-CHANNEL MNOSFET INTEGRATION TECHNIQUE

BACKGROUND OF THE INVENTION:

1. Field of the Invention:

This invention relates to non-volatile semiconductor memory devices and more particularly to integration techniques for combining variable threshold non-volatile devices with fixed threshold support devices within a single semiconductor substrate.

2. The Prior Art:

Variable threshold non-volatile semiconducting memory elements are well known in the art. These devices basically comprise an MOSFET element including a gate structure comprising a thin tunneling dielectric layer, usually silicon dioxide and a thicker dielectric trapping layer, which may be silicon nitride (MNOS) or aluminum oxide (MAOS). The application of a field in excess of a critical level across the dielectric layers causes charge to be stored at the dielectric interface provided that a source of carriers is also provided. An opposite polarity field causes charge to be removed from the interface. Charge trapped at the interface will remain for extended periods of time without the application of external fields or potentials and is commonly designated as non-volatile storage, as contrasted with dynamic storage found in other conventional semiconductor storage circuits which require either the presence of DC supply potentials or charge refresh circuitry.

Although MNOS and MAOS field effect transistors provide date storage within a single device structure, and therefore extremely high packing density, the time required to charge, or write, data states is considerably longer than that required for dynamic storage circuits. As a result, MNOS and MAOS devices have been proposed for use in memories requiring infrequent writing, that is Read Mostly Memories (RMM). Little potential has been previously predicted for use of non-volatile memory devices in Random Access Memories (RAM), in view of the slow write times required.

The design and fabrication of MNOS variable threshold devices is considerably more complex than that required for fixed threshold conventional MOSFET devices. The article, "Optimization of Charge Storage in the MNOS Memory Device", by A. M. Goodwin et al, *RCA Review*, June 1970, pp. 342–354, describes a typical design approach for the variable threshold gate dielectric of an MNOS device to provide an optimum charge storage capacity and charge retention time. A p-channel device is described having an oxide thickness of 20 angstroms and a nitride layer formed by the ammonization of silane at a temperature of 700°C.

In order to provide critical fields necessary to write and erase charge in non-volatile devices, drive voltages in excess of those normally encountered in MOSFET circuits are required. Considerable attention has previously been given to developing the dielectric structure in nondevice areas over which these high voltages must pass in order to prevent parasitic devices. U.S. Pat. No. 3,803,705, to Goodwin describes field dielectric structures including multiple layers of thermal silicon dioxide and silicon nitride (the same materials used in the variable threshold gate dielectric) covered by a thick layer of pyrolitic silicon dioxide. U.S. Pat. No. 3,646,527 to Wada et al describes n-channel variable threshold devices having an alumina or silicon nitride gate dielectric and a field dielectric of alumina, silicon dioxide/alumina, silicon nitride/alumina or silicon nitride. The article, "Triple-Density MNOS Memory Array with Field Shield", by P. J. Krick, *IBM Technical Disclosure Bulletin*, November 1973, pp. 1723–5, describes the use of a polysilicon field shield to prevent parasitic devices in an MNOS memory array circuit.

An additional problem presented by non-volatile device fabrication, is that of integrating both variable threshold memory devices and fixed threshold devices on the same semiconductor substrate to provide a functional integrated memory. The last mentioned article and U.S. Pat. No. 3,733,591 to Cricchi teach the use of p-n junction isolation between array and support areas of a substrate. In the former, both variable threshold and fixed threshold devices utilize MNOS gate dielectric structure. In the latter, more conventional silicon dioxide gate dielectric is used.

Commonly assigned, copending application Ser. No. 411,857 of Potter entitled, "Isolated Fixed and Variable Threshold Field Effect Transistor Fabrication Technique", which describes an MAOS integration technique in which the gate dielectric for the variable threshold devices is formed as initial steps in the fabrication process.

Although a substantial quantity of prior art exists which relates to variable threshold devices useful in memory systems, no effort has considered specific structures and fabrication methods which provide compatible solutions to all of the problems presented in the development of an actual product. This is particularly true with respect to n-channel devices, which although favored in MOSFET applications in view of performance superiority, particularly speed, over p-channel devices. The inherent problems of providing all enhancement mode n-channel variable threshold MNOS devices of suitable consistency and reliability for use in a product has, prior to the subsequent invention, eluded those skilled in the art.

SUMMARY OF THE INVENTION

Accordingly, it is an object of the subject invention to provide a process and structure for providing fully integrated n-channel variable threshold devices useful for either RMM or RAM applications.

The subject invention provides n-channel MNOS memory array and support devices in which a field dielectric which includes layers of alumina and thermal silicon dioxide which provides parasitic leakage control in non-device areas and also reduces the performance degrading phenomena known as soft-turn-on or sidewalk effect. Because of the criticality of charge retention characteristics associated with the dielectrics used in non-volatile devices, the formation of the variable threshold MNOS gate structure is carried out in nitrogen ambient such that stable charge density is minimized. In addition, post-gate dielectric processing steps are minimized to avoid thermal stressing which creates loss of charge retention characteristics due to surface states generation.

The foregoing and other objects, features and advantages of the invention will be apparent from the following more particular description of the preferred embodiment, as illustrated by the accompanying drawing.

Figure 1:
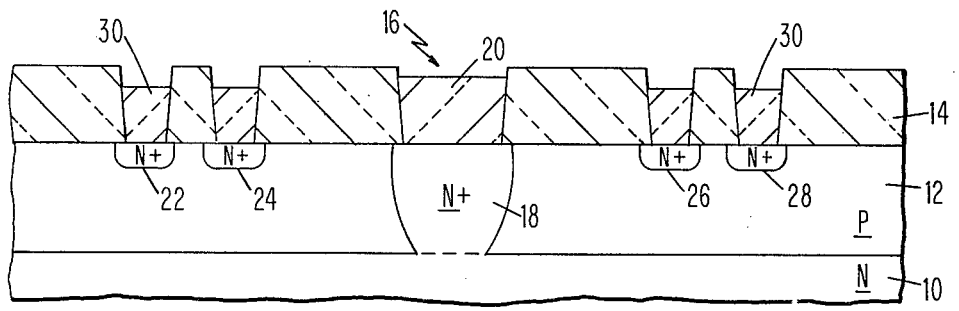
FIG. 1 is a schematic cross-sectional view of a semiconductor wafer as it appears after providing source, drain and isolation diffusions by conventional techniques.
Figure 2:
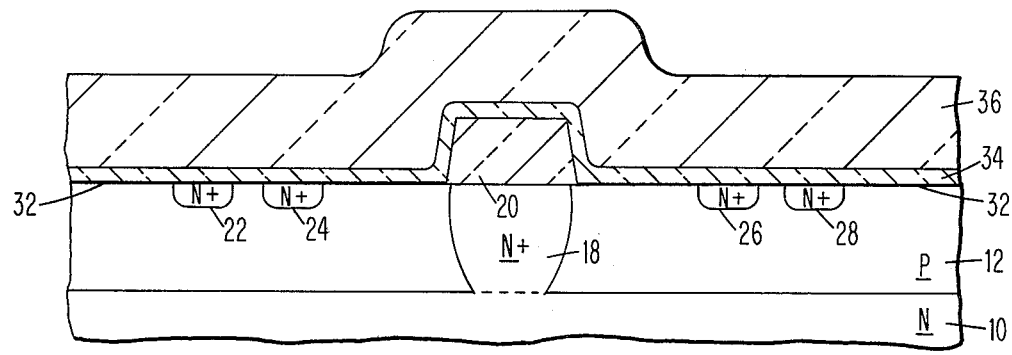
FIG. 2 is a further view of the wafer of FIG. 1 showing the initial deposition of dielectric layers used to form the field dielectric structure.

DESCRIPTION OF THE PREFERRED EMBODIMENT:

The optimization of MNOS structure and processing involves detailed considerations of, and compromise between, different functional parameters consistent to a given device application. Most important of these parameters are listed below:

1. Threshold locations and window and enhancement mode operation.
2. Window life and threshold stability.
3. "Read" or address speed.
4. "Write-Cycle" speed.
5. High-Field operability.
6. Integration requirements and charge control.

The magnitude and location of high and low thresholds and, therefore, the hysteresis window sensitivity depends on (a) the insulator structure, meaning the thicknesses of tunnel oxide and nitride for a defned stressing condition; (b) the stressing condition, meaning the pulsing scheme (pulse amplitude and duration) during write and erase operation, and (c) processing parameters of the insulator structure, meaning the methods of growing and depositing the tunnel oxide and nitride respectively, and temperature and ambient during and after the fabrication of the composite structure.

The threshold window magnitude and location are dependent upon the oxide and nitride thicknesses. For a given stressing condition, the lower flatband or threshold (due to negative voltage stressing) becomes progressively more positive with increasing tunnel oxide thickness in the range of 20 to 40 angstroms. This affects both the magnitude and symmetry of the window such that the window is reduced by almost 0.7 to 1 volt per one angstrom of increase in tunnel oxide thickness and the long-pulse-width window (pulse duration 1 sec) could be totally in the enhancement mode at tunnel-oxide thickness between 30 to 35 angstroms for a nitride thickness between 500 to 600 angstroms. It should be noted that all nitride thicknesses referred to in this specification are the tunnel oxide/nitride composite thickness measured by ellipsometry and should accordingly be corrected to obtain exact nitride thickness. For a given nitride thickness, the upper flatband or threshold (due to positive voltage stressing) is relatively insensitive to oxide thickness. The dependence of window on nitride thickness can be best described in terms of the ratio of nitride to oxide thicknesses. For a given permittivity and conductivity of nitride, the thickness of nitride affects the relative fields in tunnel oxide and nitride and, therefore, the current density difference at the interface and charge storage. For a low conductive nitride (temperature of deposition 750° to 900°C, ammonia: silane ratio equal or greater than 500:1), the long-pulse-width window is relatively less sensitive to nitride thickness as long as the ratio of $t_{nit}/t_{ox}$ is such that for a given stressing condition, the maximum field in the nitride Enit(max) $\leq$ 6.5 × $10^6$v/cm. For lower fields, nitride thickness affects the shorter pulse-width window and in particular, the symmetry of the window by regulating the field and thereby the tunneling current through the oxide as well as the amount of charge injection from the metal electrode into nitride. For higher field, nitride thickness affects the window by regulating the level of charge injection into, and conduction through, nitride and the density of "effective-traps" in the nitride. For practical device considerations, the range of tunnel oxide and nitride thicknesses are as follows:

$t_{ox}$ — 20 to 40 Å

$t_{nit}$ — 200 to 1000Å

The ratio of $t_{nit}/t_{ox}$ ranges, therefore, between 5 to 50. For $t_{nit}/t_{ox}$ in the range of 5 to 10, the hysteresis window is smaller and appears to be sensitive to nitride conductivity and uniformity. Such range has potential application for low write-voltage devices and is presently limited primarily by engineering reasons. For $t_{nit}/t_{ox}$ in the range of 30 to 50, device application is limited due to high write-voltage requirements. At moderate stressing voltage applicable to LSI (15 to 35 volts), the hysteresis window is limited in such structures due to rather low field in tunnel oxide. For $t_{nit}/t_{ox}$ in the range of 10 to 30, and for stressing condition such that maximum field in oxide is greater than about 6 × $10^6$v/cm but less than about 12 × $10^6$v/cm, the lower threshold point gets progressively more negative with increasing ratio of $t_{nit}/t_{ox}$. However, such dependence is considerably weaker than corresponding dependence on oxide thickness.

For a low conductive nitride, the magnitude of the "saturation" window (defined as the maximum window for all ranges of stressing voltage and pulse duration) usually ranges between 15 to 20 volts for oxide thicknesses between 20 to 40 angstroms and $t_{nit}/t_{ox}$ between 10 to 30. It can be shown that this saturation window is obtained when the following maximum field criteria is simultaneously satisfied in oxide and nitride.

Range for Eox(max): 9 to 12 × $10^6$v/cm
Range for Enit (max): 5 to 6.5 × $10^6$v/cm
such that Enit/Eox = $\epsilon_{ox}/\epsilon_{nit}$, where $\epsilon$ is permittivity.

From saturation window consideration, whereby appropriate fields in oxide and nitride have to be simultaneously satisfied; the $t_{nit}/t_{ox}$ is restricted even in the range of 10 to 30 from the point of view of maximum permissible stressing voltage.

For a given structure, the magnitude and symmetry of the hysteresis window sensitivity also depends on stressing amplitude and stressing duration. The stressing voltage for maximum window $V_{max}$ does not depend strongly on oxide thickness, but does depend on nitride thickness. Since $V_{max}$ does not appreciably depend on $t_{ox}$ and $t_{nit}t_{ox}$ and yet strongly on $E_{nit}$, it is obviously related to the conductivity of bulk nitride. $V_{max}$ is an important parameter in MNOS optimization. Further discussion on $V_{max}$ will be made on window life and high field operability.

Hysteresis window and its location also strongly depends on the methods of fabricating the tunnel oxide - nitride composite structure. It is believed that tunneling characteristics of the thin oxide are strongly influenced by the methods of growing the oxide and this in turn influences the window. Silicon nitride process parameters such as rate of deposition, temp of deposition, ambient, and $NH_3$ to $SiH_4$ ratio affect the conductivity of bulk nitride. Oxide - nitride processes together affect the stoichiometry of the interface and trap density in nitride at or near the interface.

Post gate heat-treatment also affects the magnitude and location of window. Increasing temperature of heat-treatment lowers the magnitude of hysteresis window and raises the lower flat-band upward. The effect is stronger in $O_2$ ambient that in $N_2$. Alteration of stoichiometry at the interface due to heat-treatment and increased oxidation of tunnel oxide in $O_2$ may explain these observed results.

The magnitude of the threshold window required at the beginning of the device life is determined by the rates at which the threshold end points change with time and by the end-of-life window requirements. Stability of threshold end points, therefore, is just as critical as the magnitude of the enhancement mode window from design considerations. Several aspects of threshold stability should be considered. These are:
1. Natural stability of high and low threshold end points (without any applied bias on the gate).
2. Stability of high and low end points during interrogation (or reading) meaning stability at interrogation voltage on the gate.
3. Stability of high and low end points during Erase-Write cycling (or writing) meaning stability with cyclic stress on the gate (fatigue) life).

For RMM application Items 1 and 2 are of primary concern while for RAM application, all the three are important. Since it is not possible to simulate exact operational conditions, design considerations should be based on worst case situation for a given application.

The natural stability (without gate bias) of high threshold end point is very strongly dependent on tunnel oxide thickness. Above $t_{ox} = 40A$, both the short term charge losses as well as long term charge losses are very small. Strong sensitivity of charge loss for thinner oxide is indicative of a direct-tunneling mechanism at the oxidenitride interface and consequent sensitivity of threshold stability on oxide thickness between 20 to 40 angstroms range of tunnel oxide thickness. It has been generally observed, that, for a given structure the high threshold is more unstable the higher or more positive the value of the higher threshold. Therefore, for all enhancement mode operation, high threshold end point of an n-channel MNOS is less stable than the corresponding end points of a p-channel MNOS. Oxide thickness, relative field in oxide and oxide processing including heat-treatment are the parameters (listed in order of importance) which affect the stability of the end points. Considerations must be given to these parameters while designing and processing the MNOS structure.

It has been determined that a positive voltage on the gate stabilizes the high threshold end point of an n-channel MNOS device, such that the effect of an interrogation voltage on the stability of the high threshold, is, obviously very significant.

In general, the natural (no bias) low threshold stability of an n-channel MNOS is quite good, and is of less of a concern. The natural charge loss is, usually, towards a lower threshold state at a rate lower than 0.1V/decade in minutes even in structures with relatively thin tunnel oxide ($t_{ox} < 30A$). However, the low threshold could be quite unstable when an appropriate interrogation voltage (positive) is applied on the gate. If the interrogation voltage is high enough and is applied for sufficient length of time, the low threshold state could shift towards the high threshold state and could eventually collapse the window. Any appreciable shift in low threshold state is unacceptable from the standpoint of read or address speed of the device, since the read speed is a function of the difference between the interrogation voltage (fixed by a power supply) and the low threshold voltage. The shift of the lower threshold state towards higher values on positive gate bias is due to partial switching or "partial writing". This low-threshold instability is related to the onset of tunneling through the tunnel oxide and can be measured in terms of the minimum applied voltage (applied for a fixed length of time) at which a detectable shift in the initial threshold can be observed. When expressed in terms of the field in tunnel oxide by taking into consideration the exact thicknesses and permittivities of oxide and nitride, this parameter is called the Onset field. Onset voltage and therefore, the low threshold stability is very sensitive to tunnel-oxide thickness in the range of direct tunneling. The onset field increases by almost an order of magnitude between tunnel-oxide thickness range of 20 to 45 angstroms. Onset field also depends on oxide processing history. Oxide grown in $N_2$ ambient (1%$O_2$, 99%$N_2$ by volume) exhibits larger onset field than similar oxide grown in $H_2$ ambient. Once the processing history is established, onset field is an accurate indicator of tunnel-oxide thickness particularly in the direct tunneling range. It will be sufficient to point out here that low threshold stability (or read-sensitivity) is very strongly dependent on oxide thickness through the tunneling onset field. It is worthwhile to mention that beyond the onset-voltage, the $\Delta V_{FB}$ is exponentially dependent on the gate voltage. This should be expected since tunneling is exponentially dependent on the voltage.

The Onset field and, therefore, the read-sensitivity of the low threshold is also very sensitive to post gate processing and heat-treatment. The onset voltage is dramatically lowered by increasing temperature of heat-treatment in $N_2$ ambient. However, heat-treatment in $O_2$ ambient showed an initial decrease at lower temperature with a definite trend of increase in onset voltage above 900°C. From simultaneous measurements on window characteristics, it is concluded that additional oxidation of tunnel oxide through nitride at higher temperatures is responsible for the increase in onset voltage during $O_2$ heat-treatment.

Fatigue, or collapse of window on cyclic stressing, is less of a concern in RMM application because of the small number of Write-Erase cycle requirements during device life. However, Fatigue characteristics would dictate the applicability of RAM non-volatile memories since, in such applications devices must exhibit stability for Write-Erase cycles of the order of $10^{11}$ to $10^{14}$ cycles. There are usually two characteristic types of window instability during Write-Erase cycling. Under less severe cyclic stressing condition and for smaller number of cycles, there can be a gradual shift of the window in one direction such that the magnitude of the window may remain the same while the low and high thresholds $V_{TL}$ and $V_{TH}$ get displaced simultaneously in the same direction and about the same magnitude, or the window may reduce due to faster displacement of $V_{TL}$. This aspect can be termed as "Threshold-Creeping". The second characteristic, which is observed under more severe stresscycling and due to larger number of cycles, exhibits rather rapid collapse of window and simultaneous generation of high density of surface states. This aspect of instability is known as "Fatigue". Instability due to cyclic stressing is a complex phenomenon. No detailed discussion will be attempted. The significance of structure and process optimization will be briefly outlined.

The phenomena of threshold creeping and Fatigue depends on stress-level and pulse duration . "Threshold-Creeping" is observed at stress levels around $V_{max}$ and is usually lower than $V_{max}$ while Fatigue is observed at stress levels above $V_{max}$. It has been shown earlier that $V_{max}$ depends on nitride thickness, nitride conductivity and pulse duration. Above $V_{max}$ rapid collapse of window occurs characterized by faster rise of lower flatband point and instability in the higher flatband point (independent of the location of the higher flatband point). Rapid rise in low threshold point is believed to be associated with a large increase in current density through bulk nitride and appreciable electron injection. It is clear, from experimental observation, that surface state generation and collapse of the threshold window are high field phenomena and should be associated with large current density through the insulator structure.

For RAM application, where fatigue is a serious concern, the switching condition (amplitude and pulse duration) and the MNOS structure should be such that $V_{erase} << V_{max}$. Device structures with low voltage Write-Erase and faster switching characteristics (thinner tunnel oxide) provide better fatigue resistance. Tunnel-oxide processing is also a very important factor for fatigue-resistant devices. For RMM application, threshold-creeping is a greater concern than fatigue. The mechanism of threshold creeping is not clear. However, threshold creeping is more pronounced when Write and Erase pulse conditions are different (pulse amplitude and duration) and when the threshold states are not 'saturated' states (that means threshold states are strongly time dependent). It is believed that progressive build-up of asymmetric field condition is responsible for threshold creeping. Further, it has been observed that even at relatively low fields ($E_{nit} < 5 \times 10^6$ v/cm) the nitride exhibits bulk trapping phenomenon and charge redistribution.

The read or address speed for the MNOS variable threshold device depends on thesquare of the difference between the read voltage and the low threshold, i.e., $(V_{gs} - V_{TL})^2$, other parameters remaining constant. For RMM application, read speed determines the performance of the memory and, therefore, probably the most important design criteria. The larger the $V_{gs} - V_{TL}$ or overdrive, the more attractive the device would be for RMM application. Since, the window should always lie in the enhancement mode (normally off devices), $V_{TL}$ must not be negative. From practical considerations, taking into account leakage and turn-on criteria, $V_{TL}$ during operational life should not drift below +1 volt. Read speed optimization, therefore, involves the following considerations:

a. Maximum allowable Vgs$_{read}$ such that stability of $V_{TL}$ is not affected during device life.
b. $V_T$ high should be large enough and stable such that at the end of life $V_{TH} - V_{gs(read)} = \Delta V_p + \Delta V_D + V_S$, where $\Delta V_p$ = Power Supply Regulation, $\Delta V_D$ = Design Tolerance, and $V_S$ = Minimum Separation from Turn-On State.

For a given structure, maximum allowable $V_{gs(read)}$ for stable $V_{T\ low}$ is primarily dictated by the Onset field. The higher the Onset field, the higher is the maximum allowable $V_{gs}$. The dependence of Onset field on tunnel oxide thickness and processing has already been discussed. For a given method of growing tunnel oxide, the thicker the oxide, the higher the Onset field. Further, the higher flatband point (and, therefore, $V_{TH}$) is relatively insensitive to tunnel oxide thickness for a given nitride thickness and Write pulse. Therefore, for faster Read speed, it is preferable to obtain a thicker tunnel-oxide MNOS structure since thicker oxide also ensures better charge retention of the higher threshold point. However, the selection of the thickest possible tunnel oxide is limited by the allowable Erase speed of the device and the need for a higher Write voltage for an equivalent window. Erase speed, however, is quite sensitive to oxide thickness. In designing the MNOS structure, therefore, consideration is given to the maximum allowable Erase speed for the given application in mind and corresponding maximum permissible tunnel oxide thickness is chosen to simultaneously satisfy the requirements of (a) all enhancement mode window, (b) high Onset field and (c) highest possible $V_{TH}$.

Write Cycle Speed is generally defined as the total time taken in a real device to replace one set of information by another. In a conventional scheme this might involve a block "erase" operation consisting of erasing a complete bit line and thereafter selectively "writing" the individual bits. Erasing the N channel MNOS enhancement mode devices implies switching from $V_{TH}$ to $V_{TL}$. The selective reverse switching, $V_{TL}$ to $V_{TH}$, is called writing. In RMM application, the total number of write-cycles during device functional life is very few. Therefore, write-cycle speed is less of a concern in device design. However, in RAM application write-cycles may be just as frequent as read cycles and therefore, write-cycle speed isof great importance in device design and application. The erase and write speeds are not equivalent in MNOS structure and are very dependent on structure and processing.

The importance of structural and process optimization on write and erase speeds will bebriefly outlined.

For a given window (i.e., $\Delta V_{FB}$ or $\Delta V_T$), the erase speed is very strongly dependent on oxide and nitride thicknesses. For a given stressing voltage, the thicker the tunnel oxide and nitride, the longer is the required erase pulse width to obtain the same window. Pulse duration increases approximately logarithmically with increase in tunnel oxide thickness. It is evident that for a reasonable window, of about 6 volts, the erase speed has to be reduced by six to seven orders of magnitude for an increase in tunnel oxide thickness by 10 angstroms. The erase speed is also very dependent on nitride thickness. Strict structure and process control is, therefore, of utmost importance in fabricating devices with reasonably reproducible erase speed.

Since erase speed is extremely slow (about 1 sec.) for structures with tunnel oxides much greater than 30 angstroms, such structures will not be applicable in RAM application. For RAM application, erase speed desired should be in the order of 10 microseconds and therefore, tunnel oxide for such structures should be in the order of 20 angstroms or less. The erase speed depends exponentially on erase-pulse amplitude and is believed to be associated with appreciable amount of electron injection from the metal into nitride and charge rearrangement near oxide/nitride interface due to rapid rise in conduction through the MNOS structure. It has been demonstrated that Pool-Frenkel type of conduction is clearly dominant in field levels greater than $5\times10^6$v/cm in such structures and that low threshold instability and pulsed degradation of window is enhanced and fatigue life is reduced when field in the MNOS insulator exceeds about $5-6\times10^6$v/cm. Therefore, for RAM application where fatigue is particularly important, the maximum useful erase speed should be limited by the maximum allowable erase pulse amplitude. Since erase speed is also dependent on tunnel oxide thickness for identical $E_{ox}$ and $E_{nit}$, it is possible to obtain one microsecond pulse width and even faster erase speed by reducing the tunnel oxide thickness and optimizing the structure.

The write speed in N-channel MNOS devices is significantly faster than erase speed and requires no particular design considerations.

Structural optimization involves careful design of the array gate for specific device applications such that the devices are written and erased well below the crital fields where undesirable changes in the composite gate insulator structure may occur. Since the switching characteristics are highly structure sensitive, optimization in the structure must be tailored to the circuit requirements and constraints, and functional requirements of the device. This point needs strong emphasis more than in any other silicon device technology since optimization involves atomic dimensions and functionality as well as reliability of a given structure is intimately related to its stressing conditions (viz, pulse amplitude and duration during write and number and frequency of write-erase cycling, interrogation levels, inhibit levels etc.).

The structural optimization of n channel MNOSFET gate insulator discussed thus far assumed a simple FET structure and processing of tunnel oxide and trapping nitride insulators only. Large scale integration of such MNOSFET (Variable Threshold) devices into a memory array with fixed threshold FETs and other devices forming peripheral circuits with driving, sensing and decoding functions in the same chip involves additional considerations and constraints. These can be categorized into two parts, (A) the functional requirements and constraints, and (B) the processing requirements and constraints.

Basically, the functional requirements involve satisfying the requirements of fixed threshold and variable threshold FET operation in the same chip. Fixed threshold FET operates at voltages considerably lower (<10 volts) than variable threshold ones (25–40 volts). This necessitates isolation between the memory arrays and peripheral support circuits. The whole circuit is fabricated on an epi layer using diffusion isolation schemes. From practical considerations, the epi thickness is limited. The thickness of epilayer and its doping level is optimized from considerations involving thresholds, diffusion and isolation breakdowns and punch-through between diffusion and substrated. High voltage functionality and enhancement mode operation leads to a number of integration requirements.

The important functional requirements can be grouped into three areas. (i) charge control in the various insulator structures, (ii) diffusion and threshold integrity during inhibit operation and (iii) threshold stability of the support gate at high voltages. Processing constraints must be taken into account in the effort to optimize structures and processes for functional requirements. Therefore, it is appropriate to review the processing constraint first before discussing the above three parts.

As has been highlighted above, the window characteristics and stability of the array FET is very critically dependent on reproducing the tunnel-oxide-nitride structure and the interfaces which show severe degradation in charge retention on high temperature heat-treatment after nitride deposition. Additionally, onset voltage and therefore, read-disturb sensitivity, is critically affected due to post nitride processing and even due to relatively lowtemperature heat-cycling. Therefore, the most important processing requirement and constraint involves an integrated scheme whereby array gate insulator is fabricated such that thermal cycling and exposures are minimized after nitride is deposited on the array gate; hence the array gate insulator processing after field and support insulators and towards the end of the process.

An indispensible step in device fabrication is the deposition of a thin layer of pyrolitic $SiO_2$ (1000 to 1500 angstroms) immediately after nitride deposition of the array gate. This pyrolitic layer acts as a mask during contact opening and may or may not form an integral part of the device structure. The conventional pyrolitic deposition process performed at lower temperatures (below 900°C) always results in high density of fixed positive charges not only in the deposited pyrolitic layer itself but in the underlying insulator structures. Although the density of positive charges can be substantially reduced by higher temperature heat-treatment after pyrolitic oxide deposition, such processing is not permissible due to reasons mentioned above. Therefore, an additional integration requirement involves the development of a low-temperature pyrolitic $SiO_2$ process with either zero or preferably slightly negative stable charge density. the most critical requirement in charge control is the need to have high positive threshold in the field structure ($V_T$ field > 40 volts). As an alternative to a silicon field shield, is a field dielectric structure whereby controlled and stable high density (about $4\times10^{11}$/cm$^2$ or greater) of negative charge can be incorporated. Alumina on thin $SiO_2$ layer is known to produce appreciable density of stable negative charges. The present thick insulator structure consists of 30 angstroms $SiO_2$–200 angstroms $Al_2O_3$–7500 angstroms pyrolitic $SiO_2$–625 angstroms Nitride. This multi-layer thick field insulator yields thick-insulator parasitic FET threshold greater than +60 volts.

The present support and array gate structures consist of 500 angstroms nitride on 500 angstroms thermal $SiO_2$ and on 34 angstroms tunnel oxide, respectively. Nitride deposition condition is optimized to yield either zero or slightly negative ($-1\times10^{11}$/cm$^2$) charge level in nitride. Devices fabricated in such a manner with tight control of $SiO_2$ charge level exhibit desired threshold of +1.0 and +1.5 volt for support and array gates respectively using a −3 volt substrate bias.

Inhibit optimization involves properly selected bias across appropriate source-drain regions (bit lines) and gates (word lines) during writing such that those bits not be written retain the threshold stability after the writing operation and no diffusion breakdown occurs during writing. Diffusion breakdown without any gate bias; i.e., $BVD_{SS}$ (with source and substrate grounded) is lower than the write pulse amplitude, and is in the order of 20 to 25 volts when the device threshold is about 1 volt. $BVD_{SS}$ is increased one to one with positive bias on the gate (i.e., one volt gate bias increases $BVD_{SS}$ by one volt) and is decreased nearly one to one per volt of high threshold. The last statement implies that $BVD_{SS}$, without gate bias, could be as low as +10 to +15 volts for a device in the high threshold state ($V_T$ high about +10 volts). The selection of an inhibit scheme is dependent on two basic considerations. The first one is the value of $BVD_{SS}$ with and without gate bias for low and high $V_T$ states of the gate. The second one is the stability of the low and high $V_T$ states on positive gate bias. The former is dependent on diffusion characteristics, substrate doping, geometry and silicon surface conditions. The latter is dependent on the MNOS structure. For inhibit requirements, stability on positive pulsing is important. Low threshold is more sensitive to positive pulsing because of partial writing than the high threshold. However, if the write-pulse duration is only 10 millisecond, the low threshold state would be stable almost up to an effective gate bias of 20 volts. This suggests that for a +35 volts write pulse, a source-drain substrate inhibit of +18 volts (effective gate bias of (35−18) or +17 volts) should be satisfactory. Such an inhibit condition would have virtually no adverse effect on stability of high threshold state. (It is interesting to note that high $V_T$ state starts erasing slowly even on moderately high positive pulsing to the gate metal when applied for longer duration.) The accelerated erasing (rapid charge loss) of high $V_T$ state on negative gate bias even for small amplitudes is due to accelerated back-tunneling of electrons from trapping sites in nitride to silicon conduction band. Fortunately, devices are not subjected to such conditions during write-erase operation. It may be pointed out that where the application demands frequent erasing, the stability of low $V_t$ on negative pulsing is quite important since a given bit may be subjected to multiple erasing over a short period of time and if not stable, may go into depletion ($V_T$ negative). Such stability is very sensitive to oxide thickness and the pulse time dependence of the window for a given erasing scheme.

Stability of a dual-dielectric fixed threshold gate insulator has been the subject of many investigators. It is generally believed that an insulator structure composed of two dielectrics of different conductivity is basically an unstable structure due to charge trapping at the interface between the two dielectric layers. The problem of stability is further complicated if one of the layers is polarizable and if there is different degrees of mobility of ionic contamination in the two layers. If the last two factors are disregarded, the stability of the dual-dielectric structure at high voltages would be dependent on the relative conductivity of the two layers and, therefore, on the respective fields at the voltage under consideration. This implies that the stability of the MNOS support gate would depend on the thicknesses of oxide and nitride, relative permittivity and conductivity. Even for a low conductive nitride, appreciable charge injection occurs at relatively low "average" field (3 to $4 \times 10^6$ V/cm). Such structures exhibit greater instability on negative stressing of the metal gate. Fortunately, for RMM type of application, the support gates are subjected to high voltage stressing only during writing. Therefore, stability on positive pulsing of the gate is most significant. Such stability can be assessed from information about the onset field as previously discussed. Since onset field is independent of oxide thickness when $t_{ox} > 100$ angstroms and is about $5.8 \times 10$ V/cm, an MNOS structure of $t_{ox} = 500$ angstroms and $5_{nit} = 550$ angstroms is stable up to $V_G$ of 45.0 volts (assuming $\epsilon_{ox}/\epsilon_{nit} = 0.52$).

In the initial periods of device fabrication, it was noted that while the switching characteristics of capacitors made on the device chip reproduced as expected from structural optimization, considerable deviation in $V_{T\ high}$ was observed in FET devices when threshold was measured at $1\mu$ amp drain current level. It was soon detected that $V_{T\ high}$ measured at around 50–100$\mu$ amp current level correspond quite well to the expected behavior. The reason for the observed smaller value of $V_{T\ high}$ and therefore smaller window at $1\mu$ amp current level could be easily traced from $I_{drain} - V_{gate}$ plots of devices at high and low states. Although the low $V_T$ state characteristic is not significantly different from fixed threshold devices, the high threshold state is characterized by appreciably high drain current at gate voltages much lower than the real high threshold state. This is known as soft-turn-on characteristics of the high threshold. Soft-turn-on is therefore responsible for an apparently smaller window and is believed to be due to the formation of parallel parasitic FETs of low or negative threshold at both edges of the real gate switched to the high threshold state. Current channels are formed between source and drain at the edges of the real device and hence the high leakage. Devices exhibiting soft-turn-on are not acceptable for not meeting obvious requirements of a) minimum sub-threshold leakage and b) minimum logic separation or window.

Parallel parasitic FET of low or negative threshold can be created inadvertently due to the following reasons:

a. Edge morphology of the gate formed due to processing philosophy and etching of the field insulator to define the gate region, b. Fringing field causing an extension of the field plate of the metal gate and c. Presence of positive charges (e.g., due to ionic contamination) around the edges of the gate close to the silicon surface and perhaps due to generation of high density of surface states during processing and stressing.

Contamination control and structural-process optimization will reduce (c) while solution of (a) and (b) involves either (i) total elimination of parallel FET formation, or (ii) raising the threshold or parallel parasitic FETs to levels in the order of or higher than the high threshold states of the real FET, or (iii) providing a means of parasitic interrupt or turn-off.

Total elimination of parasitic channels may be achieved by a closed loop ring shaped gate structure, whereby a circular source is surrounded by an annular ring of gate which in turn is surrounded by the drain. Such a structural solution totally eliminates parasitic formation due to the shape of the gate but requires complicated integration techniques.

Raising of the threshold of the parallel parasitic FETs can be accomplished either by electrical means or by alteration of edge morphology by structural changes. Importance of edge morphology on soft-turn-on has been demonstrated by careful SEM & TEM studies.

Turn-on characteristics can also be significantly improved by the application of a substrate bias. Substrate bias is, therefore, recommended for applications of MNOS devices in RMM.

Another technique of raising the threshold of the parasitic device is be relatively slowly writing it to higher threshold state. This is achieved by stressing the appropriate written bit by putting a +10 to +15 volt bias on gate and a simultaneous −15v bias on the substrate. Stressing time may vary from a fraction of a second to over 100 seconds, an undesirable performance restriction.

The parallel parasitic FET can be turned-off by introducing an additional field plate, such as described by Krick, which overlaps the edges of the gate but remains insulated from the gate electrode and appropriately biasing the field plate to turn off the parasitic.

Another approach involves providing pockets of either (a) n-type diffusion or (b) insulator with high density of negative charge between sources and drain at and near both edges of the array gate such that these regions raise the effective threshold of the parasitic FET and block the conductive channel which would have otherwise formed.

The method and structure of the instant invention effectively eliminates the effects of sub-threshold leakage by providing a field oxide which includes a layer of alumina having a stable negative charge density and when provided in the range of 100 to 200 angstroms, as described below, eliminates the formation of an observed etched region which was found to develop between the variable threshold FET gate insulator and the field insulator. By providing a field structure of 25 to 40 angstroms thermal oxide, 100 to 200 angstroms of alumina and 6000 to 8000 angstroms of pyrolitic oxide, sub-threshold leakage is substantially eliminated without adding process complicating additional masking steps or altering the basic device structure required by other solutions to the problem. In addition, negative charge density at the semiconductor-insulator surface was increased.

The simultaneous improvement in edge morphology and effective charge density was found to raise the parasitic threshold, thereby reducing sub-threshold leakage, to the point that improvement in the threshold window in excess of 5 volts was obtained.

Referring now to the figures, the preferred process and structure of the fully integrated fixed and variable threshold devices will be described.

Referring to FIG. 1, an n-type wafer 10, having a conductivity of 1–2 ohm −cm. is first etch-cleaned by utilizing the known hydrofluoric acid/Huang cleaning process. A single crystalline layer 12 of p-type silicon having a conductivity of 2 ohm-cm. is epitaxially grown to a thickness of about 6 microns by any well known technique. Thereafter, a thick masking layer 14 of thermally grown silicon dioxide is grown to a thickness of about 8000 angstroms over the entire upper surface of epitaxial layer 12. A photolithographic step follows in which a photoresist mask is applied and a hole 16 in oxide layer 14 is etched to provide an isolation region. Isolation diffusion 18 and reoxidation layer 20 are provided by conventional diffusion/drive-in techniques. The isolation diffusion should extend through epitaxial layer 12 and have resistivity of about 1–2 ohms per square. Reoxidation layer 20 has a thickness of about 6000 angstroms. Next a second photographic mask is used to simultaneously provide source and drain regions 22, 24, 26 and 28 for both fixed and variable threshold devices. As will become clearer, a representative fixed threshold MNOS device will be formed on the left side of wafer 10 and a representative variable threshold device will be formed on the right side of wafer 10.

The preferred characteristics of the source and drain region is: junction depth about 1.5 microns, resistivity 15–25 ohms per square. Reoxidation layers 30 are formed to a thickness of about 5500 angstroms.

After completion of the diffusions, a third mask is provided which will enable all of oxide layers 14, 20 and 30 to be stripped from epitaxial layer 12 except in an area adjacent to isolation diffusion 18. A layer of dry thermal oxide 32 (shown as a heavy line due to its relative thinness as compared to the other layers) of 25 to 40 angstroms is grown on epitaxial layer 12. Layer 32 is followed by a layer 34 of aluminum oxide ($Al_2O_3$), or alumina, formed by chemical vapor deposition and having a thickness of 100 to 200 angstroms. Layer 34 is followed by a second silicon dioxide layer 36, formed by pyrolitic deposition from silane and a trace of hydrogen using a nitrogen carrier, having a thickness of 7000 to 8000 angstroms. This three layer dielectric structure will form the bulk of the field oxide structure for the completed devices. The thickness of first oxide layer 32 and alumina layer 34 together provide a substantial negative surface charge state at the surface of epitaxial layer 12 to prevent parasitic devices from forming between adjacent transistors. In addition by utilizing a relatively thin layer of alumina etching of the gate regions for devices becomes more precise reducing sub-threshold parasitics within individual devices.

Figures 3A, 3B:
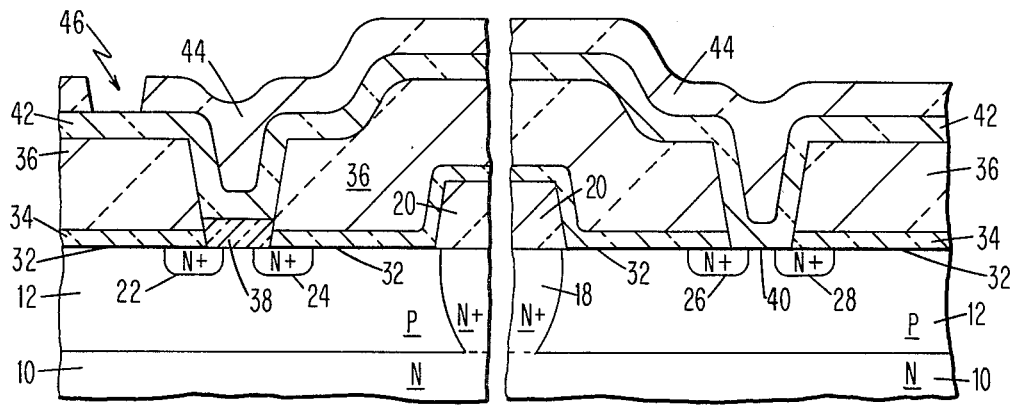
FIG. 3A is a view of a support device portion of the wafer in FIG. 1 showing the fixed threshold gate dielectric structure.
FIG. 3B is similar to FIG. 3A and shows the variable threshold MNOS device gate dielectric structure.

Referring now to FIG. 3A, there is shown only the support device half of wafer 10. After deposition of oxide layer 36, a fourth photo mask is used to define only the gate regions of the fixed threshold devices. After gate regions have been etched using hydrofluoric/phosphoric/hydrofluoric acid etchants to expose epitaxial layer 12, a dry thermal silicon dioxide layer 30 is grown, using 1.5% hydrochloric acid in oxygen at 1000°C, to a thickness of 450–525 angstroms. Layer 30 is then annealed in nitrogen for about 5 minutes. Oxide layer 30 provides a surface charge density of less than $1 \times 10^{11}$ and a breakdown voltage in excess of 40 volts.

Following the formation of support gate oxide layer 38, and now referring to both FIG.'s 3A and 3B, a fifth mask is used to define only the gate regions of the variable threshold devices (FIG. 3B), as was previously done for the support gate regions.

The variable threshold gate dielectric is formed by first growing a thin tunneling silicon dioxide layer 40 by a dry thermal oxidation process using 1% oxygen in a nitrogen carrier at 850°C for about 105 minutes until layer 40 is between 31 to 34 angstroms thick. Thereafter, a continuous layer 42 of silicon nitride is blanket deposited on the entire wafer. Nitride layer 42 has a preferred thickness of 550 to 625 angstroms and is formed from silane and ammonia in a ratio of 1:1000 at 875°C. Immediately following deposition of layer 42 another layer of pyrolitic layer 44 of silicon dioxide is deposited. Layer 44 is necessary to provide an etching mask for providing contact holes and more importantly to provide a lower charge density in nitride layer 42. Pyrolitic oxide layer 44 is formed from silicon tetrachloride in nitrogen containing only 0.06% hydrogen.

A sixth photoresist mask is then used to define the location of contact holes 46 in pyrolitic layer 44.

Figure 4:
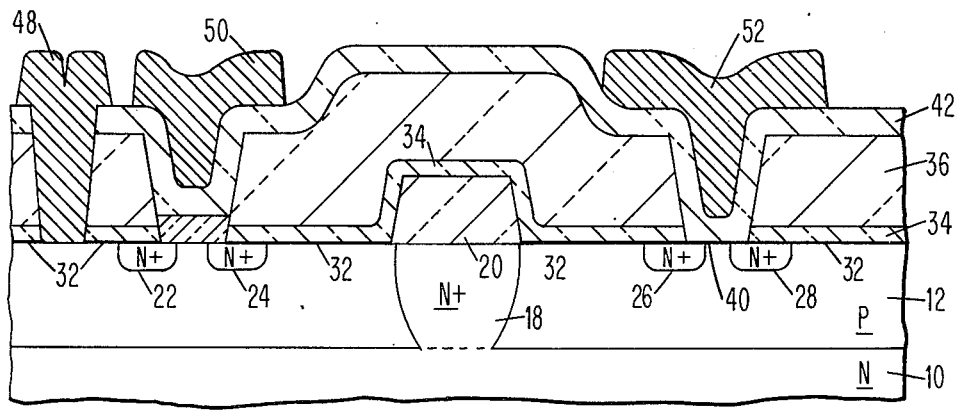
FIG. 4 is a sectional view of the wafer of FIG. 1 after the completion of the metallization layers providing gate electrodes and a substrate contact.

Referring now to FIG. 4, after contact holes have been etched to the surface of epitaxial layer 12, pyrolitic oxide layer 44 is removed and a metallization layer is provided by a low temperature evaporation technique. A seventh photo mask is then used to define metal contacts 48, fixed threshold gate electrode 50 and variable threshold gate electrode 52. Further processing and packaging may be completed as in conventional semiconductor processing techniques.

It will be observed that the formation of the gate dielectric of the variable theshold device is performed at relatively low temperatures and that after deposition of the nitride and pyrolitic oxide layer no thermal stress is provided. No final anneal is required to remove normally occurring positive charges from the n-channel surface of epitaxial layer.

A specific preferred embodiment of an integrated circuit containing fixed and variable threshold devices designed for a Read-Mostly environment was designed and fabricated which had the following characteristics.

Fixed threshold support device gate dielectric structure was 550 angstroms thermal oxide and 625 angstroms silicon nitride. Using −5 volts substrate bias, devices exhibited threshold voltages of from +1.2 to 1.3 volts, depending upon device size. Transconductance ranged from 76 micromhos for large devices to 295 micromhos for small devices.

Variable threshold array device gate dielectric structure was 34 angstroms thermal oxide and 625 angstroms silicon nitride. The average required 10 microsecond write potential pulse to provide a +10 volt threshold was +35.7 volts, while the average required 3 second erase potential pulse to reach a +2 volt threshold was −30.5 volts. The thickness of the silicon dioxide layer immediately following the nitride layer deposition was 1500 angstroms deposited at the same temperature as the nitride, 875°C. Metalization provided was evaporated aluminum doped with about 4% copper for electromigration prevention.

The field dielectric structure was 30 angstroms thermal oxide, 200 angstroms alumina and 8000 angstroms silicon dioxide. The field threshold voltage was in excess of +50 volts.

Although the invention has been particularly shown and described with reference to preferred embodiments thereof, it will be understood by those skilled in the art that the foregoing and other changes in form and details may be made therein without departing from the spirit and scope of the invention.

What is claimed is:

1. The method of making fixed and variable threshold field effect transistors comprising the steps of:
   providing a plurality of paired source and drain regions and at least one isolation region of n-type semiconductor material in a semiconductor material of p-type conductivity,
   providing a field dielectric structure over said source, drain and isolation regions comprising successive layers of silicon dioxide, aluminum oxide and silicon dioxide;
   selectively removing said field dielectric structure from the channel regions of a plurality of source and drain regions associated with fixed threshold transistors;
   growing a layer of silicon dioxide having a thickness of about 450 to 525 angstrom units in said channel regions of said fixed threshold transistors;
   selectively removing said field dielectric from the channel regions of a plurality of sorce and drain regions associated with variable threshold transistors;
   growing a layer of silicon dioxide having a thickness of about 31–34 angstrom units in said channel regions of said variable threshold transistors;
   depositing a layer of silicon nitride over said field dielectric structure and said silicon dioxide layers in said channel regions;
   depositing a layer of silicon dioxide over said silicon nitride layer; and
   depositing conductive metallurgy to interconnect said fixed and variable threshold transistors.

2. The method of claim 1 wherein said silicon dioxide layer deposited over said silicon nitride layer is removed prior to depositing said conductive metallurgy.

3. The method of claim 1 wherein the processing temperatures following the growth of said silicon dioxide layer having a thickness of 450 to 525 angstrom units are maintained at less than 900°C to prevent excessive charge accumulation.

4. The method of claim 1 wherein the thicknesses of said successive layers comprising said field dielectric are about 25–40 angstrom units of thermally grown silicon dioxide, about 100 to 200 angstrom units of aluminum oxide, and about 7000 to 8000 angstrom units of silicon dioxide.

* * * * *